United States Patent [19]
Oku et al.

[11] Patent Number: 6,062,551
[45] Date of Patent: May 16, 2000

[54] ACTIVE VIBRATION-ISOLATING DEVICE

[75] Inventors: Takeshi Oku; Shigeki Kimura; Toshifumi Sakata; Shuichi Okamoto, all of Osaka, Japan

[73] Assignee: Toyo Tire & Rubber Co., Ltd., Osaka, Japan

[21] Appl. No.: 08/882,213

[22] Filed: Jun. 25, 1997

[30] Foreign Application Priority Data

Jul. 15, 1996 [JP] Japan .................................. 8-184897

[51] Int. Cl.$^7$ .................................. F16F 5/00; F16F 9/18
[52] U.S. Cl. .................. 267/140.14; 267/122; 267/126; 267/136
[58] Field of Search .................................. 248/550, 559, 248/632, 634, 636; 267/64.16, 64.17, 64.27, 126, 136, 266.7; 188/378, 379, 380; 318/114, 648, 649; 310/311, 348; 417/417, 322

[56] References Cited

U.S. PATENT DOCUMENTS

| | | | |
|---|---|---|---|
| 3,578,278 | 5/1971 | Pickering | 248/550 |
| 3,889,936 | 6/1975 | Shimizu | 267/136 |
| 4,101,102 | 7/1978 | Lloyd | 248/550 |
| 4,468,739 | 8/1984 | Woods et al. | 280/707 |
| 4,546,960 | 10/1985 | Abrams et al. | 267/136 |
| 4,735,296 | 4/1988 | Pinson | 188/379 |
| 5,042,784 | 8/1991 | Murai et al. | 267/136 |
| 5,067,684 | 11/1991 | Garnjost | 248/550 |
| 5,127,622 | 7/1992 | Whelpley et al. | 248/550 |
| 5,222,759 | 6/1993 | Wanner et al. | 280/697 |
| 5,234,203 | 8/1993 | Smith | 267/131 |
| 5,597,292 | 1/1997 | Rhee et al. | 417/322 |
| 5,630,709 | 5/1997 | Bar-Cohen | 417/322 |
| 5,653,317 | 8/1997 | Wakui | 188/378 |

FOREIGN PATENT DOCUMENTS 6-58254  8/1994  Japan .

*Primary Examiner*—Chris Schwartz
*Attorney, Agent, or Firm*—Jones, Tullar & Cooper, P.C.

[57] ABSTRACT

The active vibration-isolating device of the invention is used for preventing vibrations due to ground motions or running of an automobile from being propagated to a platform which is disposed in, for example, a semiconductor device factory or a laser device factory, and on which various kinds of equipment are to be mounted, and also from causing the platform to vibrate. The device has: an air spring which elastically supports a platform; a piston-like member which abuts against and supports the platform; plural piezoelectric actuators which can be externally controlled; a working fluid such as an aqueous solution of ethylene glycol which transmits driving displacements of the piezoelectric actuators to the piston-like member via piston members which are respectively fixed to ends of the piezoelectric actuators in a driving direction x; and a fluid path in which the working fluid is hermetically filled. The load of equipment mounted on the platform is shared by the air spring and the piston-like member, thereby enabling the spring rate to be reduced. Therefore, the resonance frequency can be set lower. As a result, vibration-isolating performance and vibration-damping performance can be surely adequately exerted on vibrations in a wide frequency range including a low-frequency region, and a wide load range.

9 Claims, 4 Drawing Sheets

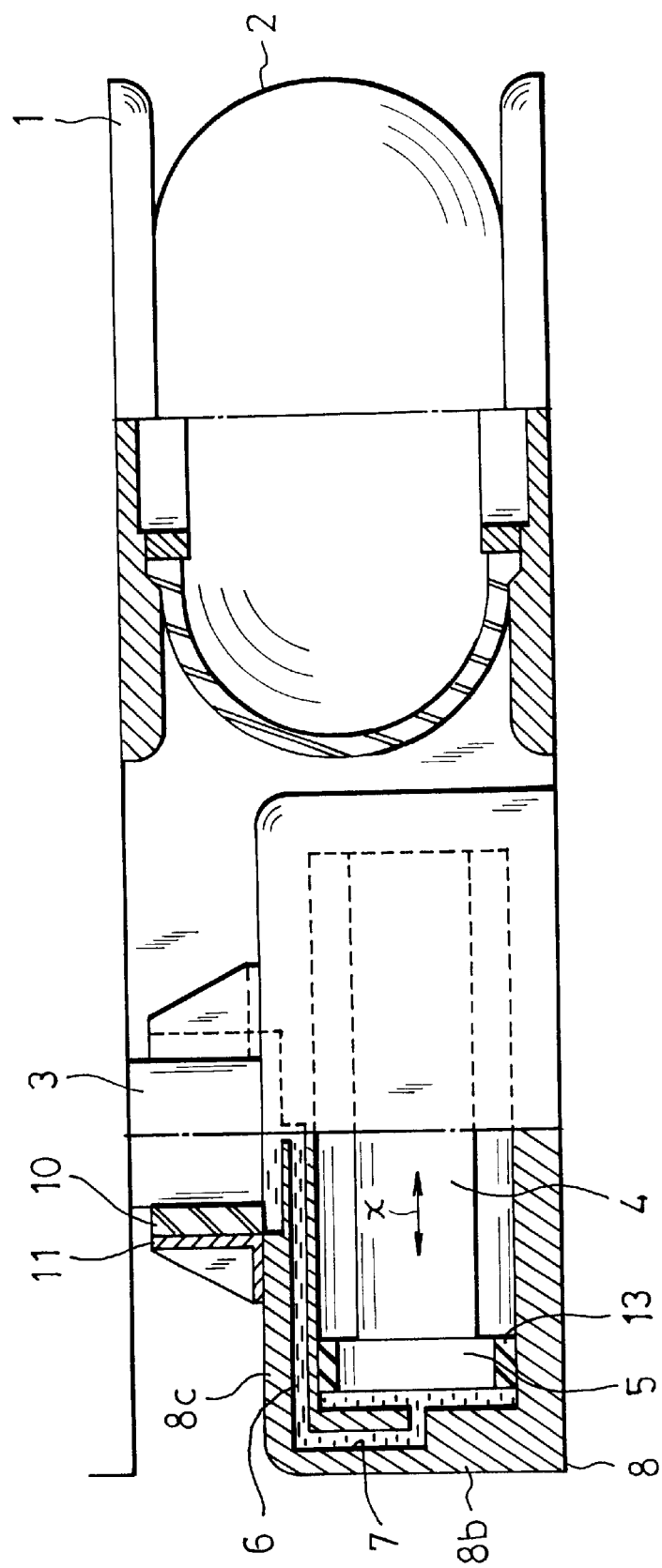

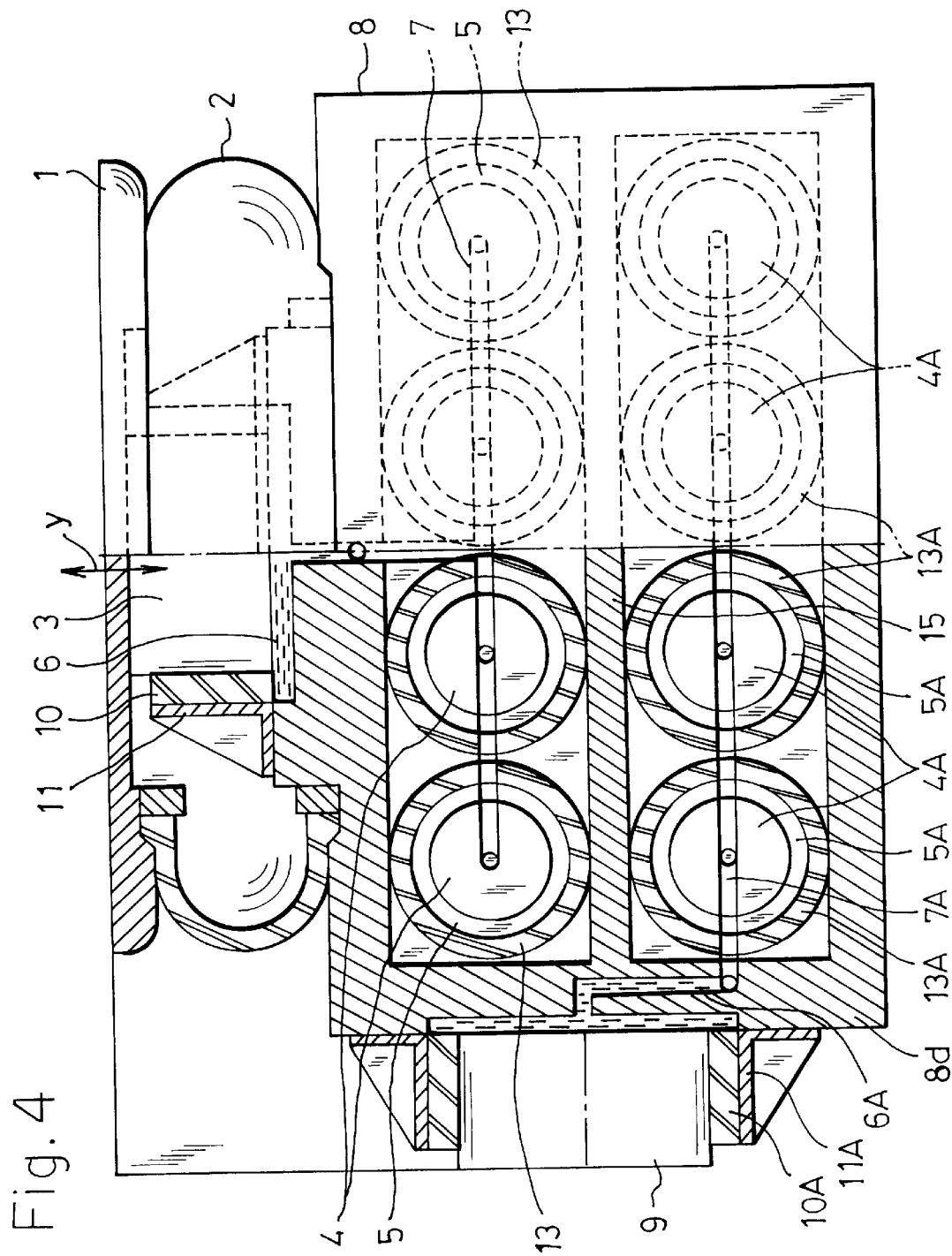

ACTIVE VIBRATION-ISOLATING DEVICE

BACKGROUND OF THE INVENTION

1. Field of the Invention

The present invention relates to a vibration-isolating device for preventing vibrations due to ground motions or running of an automobile from being propagated to a platform which is disposed in, for example, a semiconductor device factory or a laser device factory, and on which various kinds of equipment are to be mounted, and also from causing the platform to vibrate. More particularly, the present invention relates to an active vibration-isolating device which uses a piezoelectric actuator and in which the driving of the piezoelectric actuator can be externally controlled so as to interfere with vibrations of a platform, thereby eliminating excitation vibrations or vibrations in a low-frequency region of equipment mounted on the platform.

2. Description of the Prior Art

Conventionally, an active vibration-isolating device of this kind includes a device as disclosed in Laid-Open Japanese Utility Model Publication No. 6-58254. The active vibration-isolating device disclosed in the publication basically comprises a piezoelectric actuator, and a mechanism which transmits the driving displacement of the piezoelectric actuator via two piston members having different diameters and a working fluid. A rubber elastic member is adherently interposed between one or both of the two piston members having different diameters and a housing member which surrounds the piston member and has a side face that is substantially parallel with that of the piston member.

In the prior art active vibration-isolating device configured as described above, the rubber elastic member interposed between the two piston members and the housing member prevents the working fluid from leaking. Therefore, there is no friction between the piston members and the housing member, so that the piston members operate smoothly. As a result, the driving displacement of the piezoelectric actuator is efficiently transmitted via the two piston members and the working fluid, thereby enabling predetermined vibration-isolating performance and vibration-damping performance to be surely exerted.

In the prior art active vibration-isolating device, also the rubber elastic member interposed between the two piston members and the housing member shares the load of equipment mounted on the device. In the case where mounted equipment exerts a large load and the rubber elastic member must support a large shared load, such as the case where the device is disposed in a semiconductor device factory, a laser device factory, or the like, therefore, the rubber elastic member adherently interposed between the smaller-diameter piston member and the housing member is distorted and deteriorates. In order to prevent such distortion and deterioration of the rubber elastic member from occurring, the rubber elastic member must have a large spring rate. As a result, there arises a problem in that the resonance frequency is raised and the vibration-isolating performance in a low-frequency region is impaired. Furthermore, the preload to be applied to the piezoelectric actuator is increased, and hence there arises also a problem in that the driving efficiency of the piezoelectric actuator is lowered.

SUMMARY OF THE INVENTION

It is an object of the present invention to provide an active vibration-isolating device in which, even when a large load is exerted by mounted equipment, the resonance frequency can be set to be low, and the preload on a piezoelectric actuator can be easily adjusted to a value at which a high driving efficiency of the piezoelectric actuator is attained, thereby enabling predetermined vibration-isolating performance and vibration-damping performance to be surely exerted on vibrations in a wide range including a low-frequency region.

In order to attain this object, the active vibration-isolating device of the present invention comprises: an air spring which elastically supports a platform; a piston-like member which abuts against and supports the platform; a piezoelectric actuator which can be externally controlled; a working fluid which transmits a displacement of the piezoelectric actuator to the piston-like member via a piston member attached to at least one end of the piezoelectric actuator in a driving operation of the piezoelectric actuator; and a fluid path in which the working fluid is hermetically filled and through which the piston-like member is connected with the piezoelectric actuator.

According to the present invention having the features and configuration noted hereinafter, the air spring, and the piston-like member which transmits the driving displacement of the piezoelectric actuator via the working fluid, support the platform in a parallel manner, thereby causing the load from the mounted equipment to be shared by the two members. Even when the load from the mounted equipment is large, therefore, the shared load of the piezoelectric actuator can be made smaller so that disadvantages such as restriction of the operation range of the piezoelectric actuator and interference of the controlling force can be eliminated. Furthermore, the spring rate can be made smaller so that the resonance frequency is set lower. Therefore, predetermined vibration-isolating performance and vibration-damping performance can be surely exerted on vibrations in a wide frequency range including a low-frequency region, and a wide load range. Moreover, the ratio between the shared loads of the air spring and the piston-like member can be arbitrarily adjusted. Unlike the case where the air spring and the piston-like member support the platform in a serial manner, therefore, the preload on the piezoelectric actuator which transmits the driving displacement to the piston-like member can be easily adjusted to a value at which a high driving efficiency of the piezoelectric actuator is attained. As a result, the device of the present invention can attain an effect that predetermined vibration-isolating performance and vibration-damping performance can be exerted adequately and stably.

Other objects and effects of the invention will be apparent from the following description of embodiments.

BRIEF DESCRIPTION OF THE DRAWINGS

FIG. 3 is a longitudinal half section side view showing a second embodiment of the active vibration-isolating device of the present invention; and FIG. 4 is a longitudinal half section front view showing a third embodiment of the active vibration-isolating device of the present invention.

DESCRIPTION OF THE PREFERRED EMBODIMENTS OF THE INVENTION

Hereinafter, embodiments of the present invention will be described with reference to the accompanying drawings.

Figure 1:
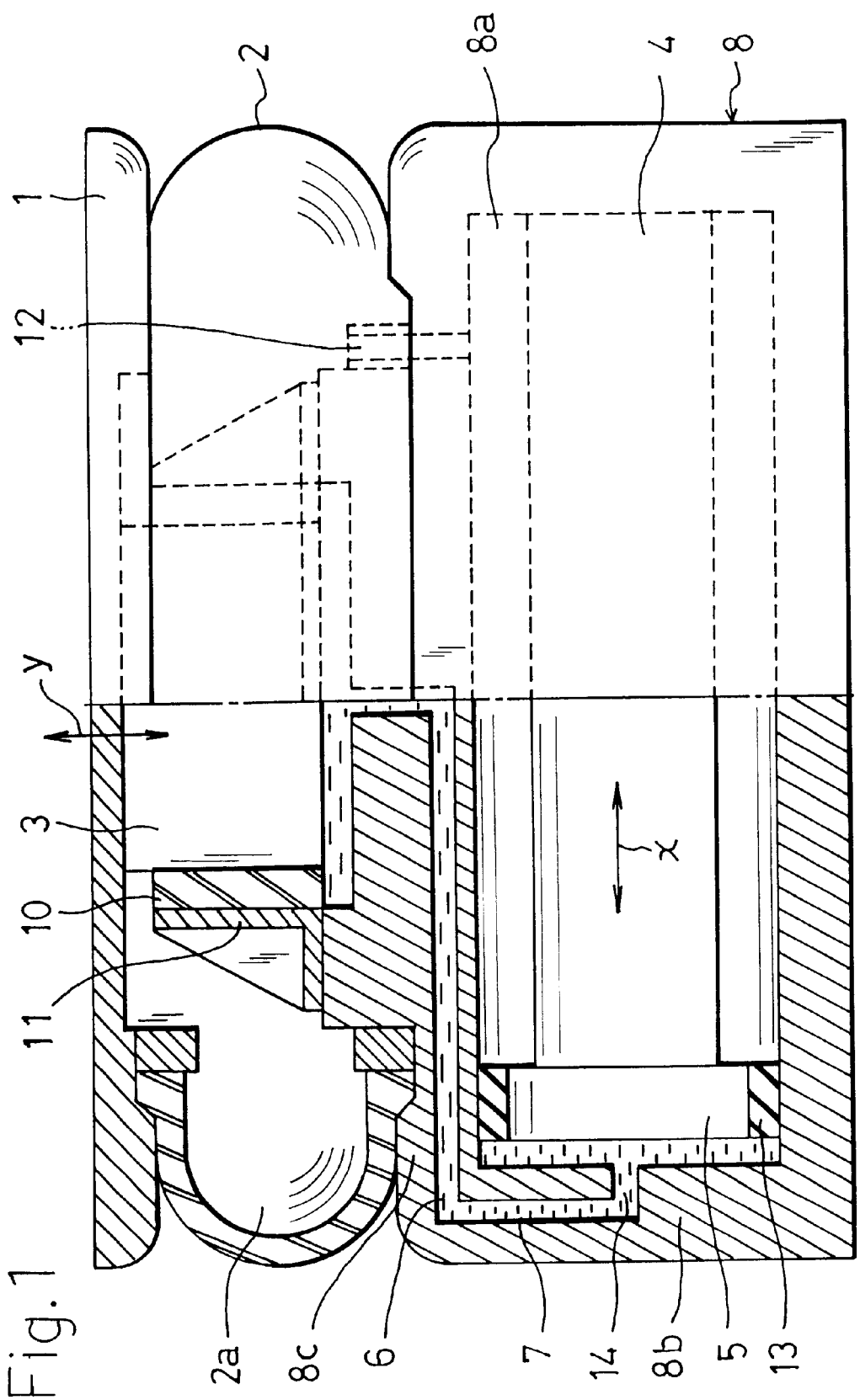
FIG. 1 is a longitudinal half section side view showing a first embodiment of the active vibration-isolating device of the present invention.
Figure 2:
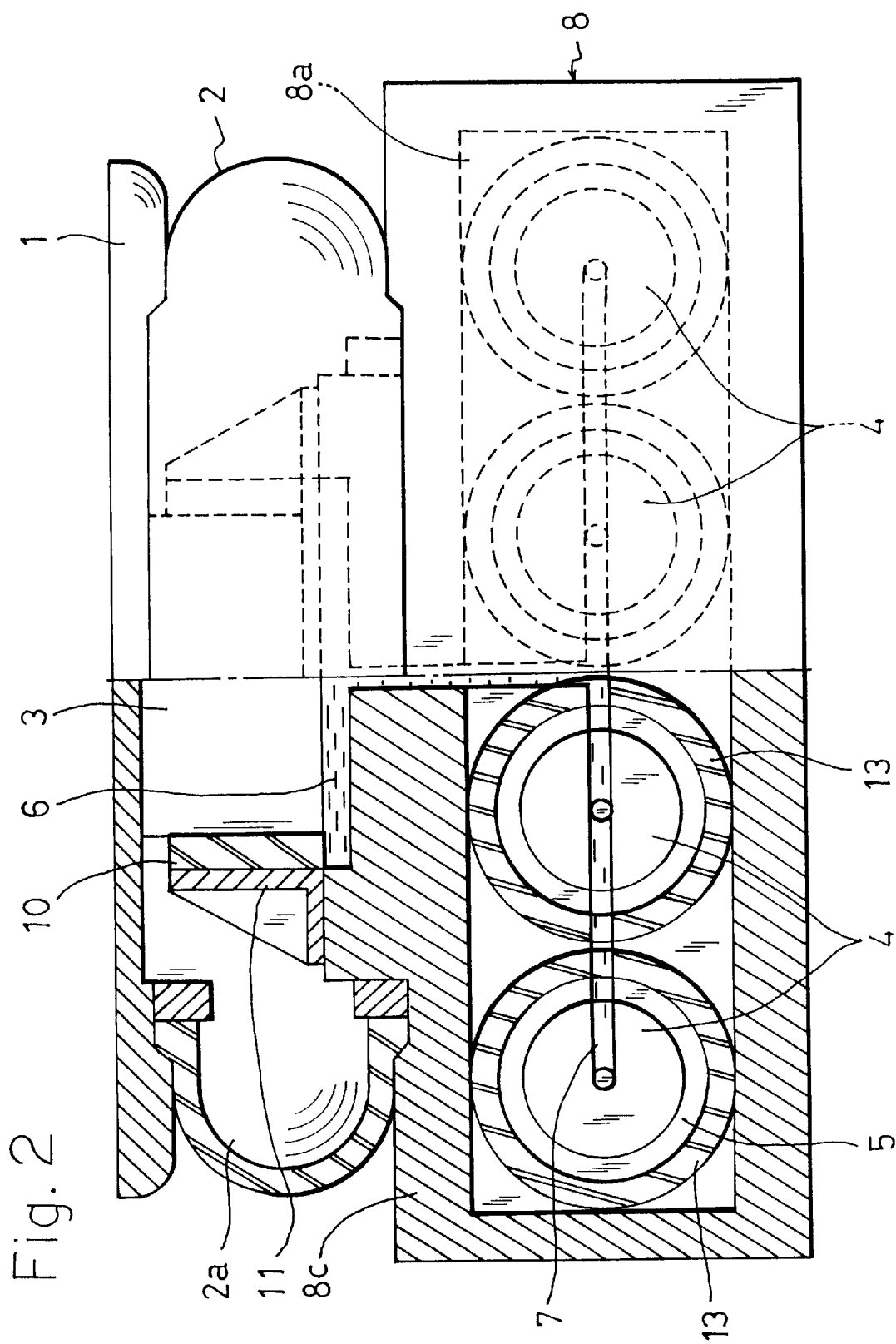
FIG. 2 is a longitudinal half section front view of the active vibration-isolating device.

FIG. 1 is a longitudinal half section side view showing a first embodiment of the active vibration-isolating device of the present invention, and FIG. 2 is a longitudinal half section front view of the active vibration-isolating device. The device mainly comprises: an air spring 2 which is placed below a platform 1 and which elastically supports the platform 1; a piston-like member 3 which abuts against the lower face of the platform 1 and supports the platform 1; piezoelectric actuators 4 such as stacked piezoelectric elements which are arranged at regular intervals in a horizontal plane in such a manner that their driving directions (the direction of the arrow x) are parallel with each other, and which can be externally controlled (although four piezoelectric actuators are shown in the drawings, the present invention may be executed by using two or more piezoelectric actuators); an actuator case 8 which houses the plural piezoelectric actuators 4 that are arranged in parallel, and which is disposed on a floor; piston members 5 which are respectively fixed to ends of the piezoelectric actuators 4 in the driving direction x; a working fluid 6 such as an aqueous solution of ethylene glycol which transmits driving displacements of the piezoelectric actuators 4 to the piston-like member 3 via the piston members 5; and a fluid path 7 in which the working fluid 6 is hermetically filled.

The actuator case 8 is formed as a whole into a box-like shape in which the plan view is substantially square. The actuator case 8 is placed so that the driving directions (the direction of the arrow x) of the piezoelectric actuators 4 housed in the case are perpendicular to the direction of the principal elastic axis (the direction of the arrow y) of the platform 1 due to the air spring 2. A cylindrical holder 11 is fixed to the actuator case 8. The cylindrical holder 11 fittingly supports the piston-like member 3 via a cylindrical rubber seal 10 in such a manner that the piston-like member is vertically movable, immediately above the actuator case 8 and in a center portion of the area where the air spring 2 elastically supports the platform 1. The lower end of the air spring 2 is fixedly supported by the upper face of the actuator case 8 in the vicinity of the outer periphery of the cylindrical holder 11. As a result, the air spring 2 and the piston-like member 3 are integrated with each other via the actuator case 8.

The actuator case 8 is hermetically sealed. The inner space 8a of the case is communicated with the inner space 2a of the air spring 2 via an orifice 12, whereby the inner space 8a of the actuator case 8 is caused to function as an auxiliary tank for the air spring 2.

Rubber rings 13 are fitted onto the outer peripheral faces of the piston members 5, respectively. Plural working fluid paths 14 are formed in a wall 8b on the side of one end of the actuator case 8 so as to respectively correspond to the piston members 5. The fluid path 7 elongating from one end at which the working fluid paths 14 are collected, to the other end which is directly below the piston-like member 3 is formed in the thicknesses of the one-end wall 8b and an upper wall 8c of the actuator case 8.

The air spring 2 is configured by filling pressurized air into a flexible bag-like member which is inflatable and deflatable and made of, for example, a ply cord formed by interposing reinforcing bead wires between inner and outer rubber layers. The spring rate of the air spring can be adequately changed by adjusting the pressure of the filler air, in accordance with the weight of equipment to be mounted, and the operation conditions.

Next, the operation of the thus configured active vibration-isolating device of the first embodiment will be described.

The loads of the mounted equipment and the platform 1 are shared by the air spring 2, and the plural piezoelectric actuators 4 via the piston-like member 3 and the working fluid 6. Even when the load of the mounted equipment is large, therefore, the shared loads of the piezoelectric actuators 4 can be made smaller so that disadvantages such as restriction of the operation ranges of the piezoelectric actuators 4 and interference of the controlling force can be eliminated. Furthermore, the spring rate can be made smaller so that the resonance frequency is set to be lower. These enable predetermined vibration-isolating performance and vibration-damping performance to be exerted on vibrations in a wide frequency range including a low-frequency region. Moreover, the ratio between the shared loads of the air spring 2 and the piston-like member 3 can be arbitrarily adjusted. Unlike the case where the air spring 2 and the piston-like member 3 support the platform in a serial manner, therefore, the preloads on the piezoelectric actuators 4 which transmit the driving displacements to the piston-like member 3 can be easily adjusted to a value at which the driving efficiencies of the piezoelectric actuators 4 are not impaired. As a result, predetermined vibration-isolating performance and vibration-damping performance can be exerted adequately and stably.

In the first embodiment, the position where the piston-like member 3 supporting the platform 1 is located is in a center portion of the area where the air spring 2 elastically supports the platform 1. Therefore, the whole of the device can be compactly configured, and handled as a single unit, and hence assembling work or the like can be easily conducted. The actuator case 8 is placed so that the driving directions x of the piezoelectric actuators 4 housed in the case are perpendicular to the direction y of the principal elastic axis of the platform 1 due to the air spring 2, and the air spring 2 and the piston-like member 3 are integrated with each other via the actuator case 8. Therefore, the buckling strength of the vibration-isolating device as a whole is enhanced, so that the device can support a larger load of equipment to be mounted.

The first embodiment has a configuration in which the actuator case 8 is hermetically sealed and the inner space 8a of the hermetically sealed actuator case 8 is communicated with the inner space 2a of the air spring 2. Therefore, the actuator case 8 can function as an auxiliary tank for the air spring 2, thereby allowing the spring rate of the air spring 2 to be set to a smaller value. As a result, the predetermined vibration-isolating performance and vibration-damping performance can be further enhanced, the application range can be widened, and also a cold reserving effect on the piezoelectric actuators 4 can be attained.

FIG. 3 is a longitudinal half section side view showing a second embodiment of the active vibration-isolating device of the present invention. In the second embodiment, the air spring 2 and the actuator case 8 are juxtaposed horizontally or laterally, and the position where the air spring 2 elastically supports the platform 1 is spatially separated from that where the piston-like member 3 and the piezoelectric actuators 4 support the platform 1. The other components of the second embodiment are configured in the same manner as those of the first embodiment shown in FIGS. 1 and 2. Therefore, the corresponding components are designated by the same reference numerals, and their detailed description is omitted. In the second embodiment, an orifice through which the inner space of the actuator case 8 is communicated with that of the air spring 2 is not formed. In place of such an orifice, an external pipe may be used so as to communicate the spaces with each other.

Also in the active vibration-isolating device of the second embodiment shown in FIG. 3, in the same manner as the first embodiment described above, the loads of the mounted equipment and the platform 1 are shared by the air spring 2, and the plural piezoelectric actuators 4 via the piston-like member 3 and the working fluid 6. Consequently, vibration-isolating performance and vibration-damping performance which are equal in level to those of the first embodiment can be exerted.

FIG. 4 is a longitudinal half section front view showing a third embodiment of the active vibration-isolating device of the present invention. In the third embodiment, a partition wall 15 is formed at the middle position in the vertical direction of the actuator case 8 of the active vibration-isolating device which is configured in a similar manner as the first embodiment described above in detail. The plural piezoelectric actuators 4 are housed in the space above the partition wall 15, and plural other piezoelectric actuators 4A are housed in the space below the partition wall 15. Another piston-like member 9 is disposed on one side wall 8d of the actuator case 8 encircled by a cylindrical rubber seal 10A and a cylindrical holder 11A. The other piston-like member 3 abuts against a side face of the platform 1 in a direction which is perpendicular to the direction (the direction of the arrow y) of the axis of the support of the platform 1 due to the air spring 2 and the piston-like member 3, thereby supporting the platform 1. A fluid path 7A is formed in the thicknesses of the one-end wall 8b of the actuator case 8 and the side wall 8d which perpendicularly intersects the one-end wall 8b. In the fluid path 7A, hermetically filled is a working fluid 6A such as an aqueous solution of ethylene glycol which transmits the driving displacements of the plural other piezoelectric actuators 4A to the other piston-like member 9 via piston members 5A respectively fixed to ends on one side of the other piezoelectric actuators 4A. Rubber rings 13A are fitted onto the outer peripheral faces of the other piston members 5A, respectively.

Also in the active vibration-isolating device of the third embodiment shown in FIG. 4, in the same manner as the first and second embodiments described above, the vertical loads of the mounted equipment and the platform 1 are shared by the air spring 2, and the plural piezoelectric actuators 4 via the piston-like member 3 and the working fluid 6. Also horizontal vibrations acting on the platform 1 can be controlled by the other piston-like member 9, the working fluid 6A, and the other piezoelectric actuators 4A. While using a single device so as to reduce the required installation space to a size as small as possible, predetermined vibration-isolating performance and vibration-damping performance can be exerted on vertical and horizontal vibrations acting on the mounted equipment.

In the above, the embodiments in which the plural piezoelectric actuators 4 or 4A are used have been described. Alternatively, a single piezoelectric actuator 4 or 4A may be used. In the embodiments, one piston member 5 or 5A is attached to one piezoelectric actuator 4 or 4A. Alternatively, one piston member 5 or 5A may be commonly used for plural piezoelectric actuators 4 or 4A.

Although not illustrated, the plural piezoelectric actuators 4 or 4A may be housed in the actuator case 8 while the actuators are radially arranged in one plane. The shape of the actuator case 8 is not restricted to a box-like shape, and the case may have another shape such as a column-like shape or a star-like shape.

What is claimed is:

1. An active vibration-isolating device, comprising:
   an air spring which elastically supports a platform on which equipment is capable of being mounted;
   a piston member which abuts against and supports the platform;
   a piezoelectric actuator which can be externally controlled, said piezoelectric actuator having a piston member attached to at least one end of said piezoelectric actuator;
   a working fluid which transmits a displacement of said piezoelectric actuator to said piston member which abuts against and supports the platform via said piston member which is attached to at least one end of said piezoelectric actuator in a driving operation of said piezoelectric actuator; and
   a fluid path in which said working fluid is hermetically filled and through which said piston member which is attached to at least one end of said piezoelectric actuator is attached with said piezoelectric actuator,
   wherein a position where said piston member which abuts against and supports the platform is spatially separated from a position where said air spring elastically supports the platform.

2. An active vibration-isolating device according to claim 1, wherein said device comprises a plurality of said piezoelectric actuators, and said piezoelectric actuators are arranged in parallel so that driving directions of said piezoelectric actuators are parallel with each other.

3. An active vibration-isolating device according to claim 1, further comprises:
   a case for said piezoelectric actuator in which a fluid is integrally incorporated;
   another piston member which abuts against the platform in a direction which is perpendicular to a direction of an axis defined by a support of the platform by said air spring and said piston member which abuts against and supports the platform; and
   another piezoelectric actuator which transmits a displacement to said other piston member which abuts against the platform via a working fluid filled in said fluid path.

4. An active vibration-isolating device, comprising:
   an air spring which elastically supports a platform on which equipment is capable of being mounted;
   a piston member which abuts against and supports the platform;
   a piezoelectric actuator which can be externally controlled, said piezoelectric actuator having a piston member attached to at least one end of said piezoelectric actuator;
   a working fluid which transmits a displacement of said piezoelectric actuator to said piston member which abuts against and supports the platform via said piston member which is attached to at least one end of said piezoelectric actuator in a driving operation of said piezoelectric actuator; and
   a fluid path in which said working fluid is hermetically filled and through which said piston member which is attached to at least one end of said piezoelectric actuator is attached with said piezoelectric actuator; and
   a case in which said piezoelectric actuator is disposed, wherein a position where said piston member which abuts against and supports the platform is in a center position of an area where said spring elastically supports the platform, wherein the platform defines a principal elastic axis, wherein said piezoelectric actuator is disposed in said case so that the driving direction of said piezoelectric actuator is perpendicular to a direction of said principal elastic axis of the platform due to said air spring, and wherein a side of said air spring is fixedly supported by said case, said side being opposite to the side supporting the platform.

5. An active vibration-isolating device according to claim 4, wherein said device comprises a plurality of said piezoelectric actuators, and said piezoelectric actuators are arranged in parallel so that driving directions of said piezoelectric actuators are parallel with each other.

6. An active vibration-isolating device, comprising:

an air spring which elastically supports a platform on which equipment is capable of being mounted;

a piston member which abuts against and supports the platform;

a piezoelectric actuator which can be externally controlled, said piezoelectric actuator having a piston member attached to at least one end of said piezoelectric actuator;

a working fluid which transmits a displacement of said piezoelectric actuator to said piston member which abuts against and supports via said piston member which is attached to at least one end of said piezoelectric actuator in a driving operation od said piezoelectric actuator;

a fluid path in which said working fluid is hermetically filled and through which said piston member which is attached to at least one of said piezoelectric actuator, is attached with said piezoelectric actuator;

a case for said piezoelectric actuator in which said fluid path is integrally incorporated;

another piston member which abuts against the platform in a direction which is perpendicular to a direction of an axis defined by a support of the platform by said air spring and said piston member which abuts against and supports the platform; and another piezoelectric actuator which transmits a displacement to said other piston member which abuts against the platform via said working fluid in said fluid path.

7. An active vibration-isolating device, comprising:

an air spring which elastically supports a platform on which equipment is capable of being mounted;

a piston member which abuts against and supports the platform;

a piezoelectric actuator which can be externally controlled, said piezoelectric actuator having a piston member attached to at least one end of said piezoelectric actuator;

a working fluid which transmits a displacement of said piezoelectric actuator to said piston member which abuts against and supports the platform via said piston member which is attached to at least one end of said piezoelectric actuator in a driving operation of said piezoelectric actuator;

a fluid path in which said working fluid is hermetically filled and through which said piston member which is attached to at least one end of said piezoelectric actuator, is attached with said piezoelectric actuator;

a case for said piezoelectric actuator in which said fluid path is integrally incorporated;

another piston member which abuts against the platform in a direction which is perpendicular to a direction of an axis defined by a support of the platform by said air spring and said piston member which abuts against and supports the platform; and another piezoelectric actuator which transmits a displacement to said other piston member which abuts against the platform via said working fluid filled in said fluid path, wherein a position where said piston member which abuts against and supports the platform is in a center portion of an area where said spring elastically supports the platform.

8. An active vibration-isolating device, comprising:

an air spring which elastically supports a platform on which equipment is capable of being mounted;

a piston member which abuts against and supports the platform;

a piezoelectric actuator which can be externally controlled, said piezoelectric actuator having a piston member attached to at least one end of said piezoelectric actuator;

a working fluid which transmits a displacement of said piezoelectric actuator to said piston member which abuts against and supports the platform via said piston member which is attached to at least one end of said piezoelectric actuator in a driving operation of said piezoelectric actuator;

a fluid path in which said working fluid is hermetically filled and through which said piston member which is attached to at least one end of said piezoelectric actuator is attached with said piezoelectric actuator;

a case for said piezoelectric actuator in which said fluid path is integrally incorporated;

another piston member which abuts against the platform in a direction which is perpendicular to a direction of an axis defined by a support of the platform by said air spring and said piston member which abuts against and supports the platform; and a further plurality of piezoelectric actuators arranged in parallel so that the driving directions of said further plurality of piezoelectric actuators are parallel with each other, wherein another piezoelectric actuator of said further plurality of piezoelectric actuators transmits a displacement to said other piston member which abuts against the platform via said working fluid filled in said fluid path, and wherein a position where said piston member which abuts against and supports the platform is in a center portion of an area where said spring elastically supports the platform.

9. An active vibration-isolating device, comprising:

an air spring which elastically supports a platform on which equipment is capable of being mounted;

a piston member which abuts against and supports the platform;

a piezoelectric actuator which can be externally controlled, said piezoelectric actuator having a piston member attached to at least one end of said piezoelectric actuator;

a working fluid which transmits a displacement of said piezoelectric actuator to said piston member which abuts against and supports the platform via said piston member which is attached to at least one end of said piezoelectric actuator in a driving operation of said piezoelectric actuator;

a fluid path in which said working fluid is hermetically filled and through which said piston member which is attached to at least one end of said piezoelectric actuator is attached with said piezoelectric actuator;

a case in which said piezoelectric actuator is disposed and in which said fluid path is integrally incorporated, said case being hermetically sealed with an inner space thereof communicating with an inner space of said air spring;

another piston member which abuts against the platform in a direction which is perpendicular to a direction of an axis defined by a support of the platform by said air spring and said piston member which abuts against and supports the platform; and another piezoelectric actuator which transmits a displacement to said other piston member which abuts against the platform via said working fluid filled in said path, wherein a position where said piston member which abuts against and supports the platform is in a center portion of an area where said spring elastically supports the platform.

* * * * *

UNITED STATES PATENT AND TRADEMARK OFFICE
CERTIFICATE OF CORRECTION

PATENT NO. : 6,062,551
DATED : May 16, 2000
INVENTOR(S) : Takeshi Oku et al

It is certified that error appears in the above-indentified patent and that said Letters Patent is hereby corrected as shown below:

Claim 4, line 54, delete "and".

Claim 6, line 22, change "od" to --of--.

Signed and Sealed this

Twenty-seventh Day of March, 2001

Attest:

NICHOLAS P. GODICI

Attesting Officer

Acting Director of the United States Patent and Trademark Office